United States Patent
Klein et al.

(10) Patent No.: US 12,242,187 B2
(45) Date of Patent: Mar. 4, 2025

(54) MAGNIFICATION RAMP SCHEME TO MITIGATE TEMPLATE SLIPPAGE

(71) Applicant: CANON KABUSHIKI KAISHA, Tokyo (JP)

(72) Inventors: Jeffrey Dean Klein, Austin, TX (US); Steven T. Jenkins, Round Rock, TX (US); Atsushi Kusaka, Shimotsuke (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/481,897

(22) Filed: Oct. 5, 2023

(65) Prior Publication Data
US 2024/0036465 A1    Feb. 1, 2024

Related U.S. Application Data

(62) Division of application No. 17/210,209, filed on Mar. 23, 2021, now Pat. No. 11,815,811.

(51) Int. Cl.
*G03F 7/00*    (2006.01)

(52) U.S. Cl.
CPC ............... *G03F 7/0002* (2013.01)

(58) Field of Classification Search
CPC .................. G03F 7/0002; G05B 13/0255
See application file for complete search history.

(56) References Cited

U.S. PATENT DOCUMENTS

| | | | |
|---|---|---|---|
| 2005/0225273 A1 | 10/2005 | Yoshitomi | |
| 2007/0287081 A1* | 12/2007 | Cherala | G03F 7/70633 430/22 |
| 2010/0044917 A1* | 2/2010 | Kruijt-Stegeman | B82Y 40/00 264/293 |
| 2018/0284604 A1 | 10/2018 | Choi | |
| 2019/0366620 A1* | 12/2019 | Kusaka | B29C 59/026 |

\* cited by examiner

*Primary Examiner* — Alex A Rolland
(74) *Attorney, Agent, or Firm* — Canon U.S.A., Inc., IP Division

(57) ABSTRACT

A method and system for supplying control signals to two or more force actuators wherein each of the two or more force actuators having a defined force value. The method includes sending a first set of control signals to each of the actuators to ramp forces supplied to reach the defined force value at a same initial defined value time and sending a second set of control signals to each of the actuators to reduce the forces supplied starting at a same final defined value time to individual set point values, and wherein each of the two or more force actuators reach their individual set point values at a same set point time.

6 Claims, 11 Drawing Sheets

MAGNIFICATION RAMP SCHEME TO MITIGATE TEMPLATE SLIPPAGE

CROSS-REFERENCE TO RELATED APPLICATIONS

This application is a divisional application of U.S. patent application Ser. No. 17/210,209 filed on Mar. 23, 2021, the entirety of which is incorporated herein by reference.

TECHNICAL FIELD

The disclosure relates to a control system in nanoimprint lithography, more specifically to a system that controls forces to be applied by actuators during an imprint lithography process.

BACKGROUND

In nanoimprint lithography, the goal is to transfer a pattern of an imprint template to a corresponding field on a substrate. To achieve this, curable liquid resist is dispensed on the substrate and the template is caused to contact the substrate so that, after a curing process, the pattern on the template is transferred to a particular field on the substrate. In order to facilitate this process, forces are applied to the template by actuators in order to modify the template shape which helps reduce the difference in shape between the template and the substrate.

This distortion occurs using a plurality of actuators that apply forces at the edges of the template. A problem associated with this is that, prior to contacting the curable liquid resist with the template, template magnification forces are ramped up to a level at or above a threshold level. This results in each of the plurality of actuators reaching the level at different times during the Magnification (Mag) ramp trajectory. This causes Mag in-balance forces that leads to template slippage and errors in registration and overlay control. It is particularly problematic when this occurs prior to the template contacting the substrate during dispensing of the liquid curable resist.

In an exemplary Mag ramp scheme currently in use five ramp trajectories are used for each of the 5 distortion setpoints (MagX, MagY, Skew, TrapX, and TrapY). The output of these 5 distortion trajectories is then multiplied by a correction ratio matrix to yield the individual actuator force setpoints for each of the plurality of actuators. As a result, each of the plurality of actuators reach an upper limit at different times and also exit the upper limit period at different times from one another when ramping toward the next control loop control magnification applied for a next field on the substrate. These are illustrated in FIGS. 11-13. The drawback associated with this scheme is the actuator force in-balance caused when respective actuators enter or exit the upper limit period resulting in possible template slippage and an application of unwanted high-order distortions. Therefore, it is desirable to provide control mechanism to resolve the problems described hereinabove.

SUMMARY

According to present disclosure, a method and system are provided for supplying control signals to two or more force actuators, wherein each of the two or more force actuators has a defined force value. The method includes sending a first set of control signals to each of the actuators to ramp forces supplied to reach the defined force value at a same initial defined value time and sending a second set of control signals to each of the actuators to reduce the forces supplied starting at a same final defined value time to individual set point values, and wherein each of the two of more force actuators reach their individual set point values at a same set point time.

In one embodiment, the defined force value represents a maximum amount of force able to be applied by each actuator or the defined force value represents a minimum amount of force able to be applied by each actuator.

In other embodiment, each of the first set of control signals and second set of control signals includes respective force trajectories to be applied to each of the actuators that control an amount of force applied by the each of the actuators over time. Further, for each actuator of the two or more actuators, the force trajectory is calculated based on at least one force parameter and a correction matrix that transforms values of the at least one force parameter across a total number of the two or more actuators. The calculated force trajectories are sent, as first control signals or second control signals, to respective actuators of the two or more actuators, wherein control signals are sent as first control signals if a time is earlier than the initial defined value time and the control signals are sent as second control signals if a time is later than the final defined value time.

In another embodiment, the first control signals and the second control signals cause each of the at least two actuators to be ramped together at a common ramp start time and for a same ramp duration.

According to a further embodiment, for each actuator of the two or more actuators, a ramp trajectory is calculated over a given ramping period that causes the respective actuator to reach the initial defined value time at a same time and the calculated ramp trajectories are sent, as first control signals or second control signals, to respective actuators of the two or more actuators, wherein control signals are sent as first control signals if a time is earlier than the initial defined value time and the control signals are sent as second control signals if a time is later than the final defined value time. Further, the ramp trajectory is iteratively updated during ramping period to calculate, for each actuator of the two or more actuators, force trajectory values for a given elapsed time within the ramping period.

The details of one or more implementations of the subject matter described in this specification are set forth in the accompanying drawings and the description below. Other potential features, aspects, and advantages of the subject matter will become apparent from the description, the drawings, and the claims.

DETAILED DESCRIPTION

Figure 1:
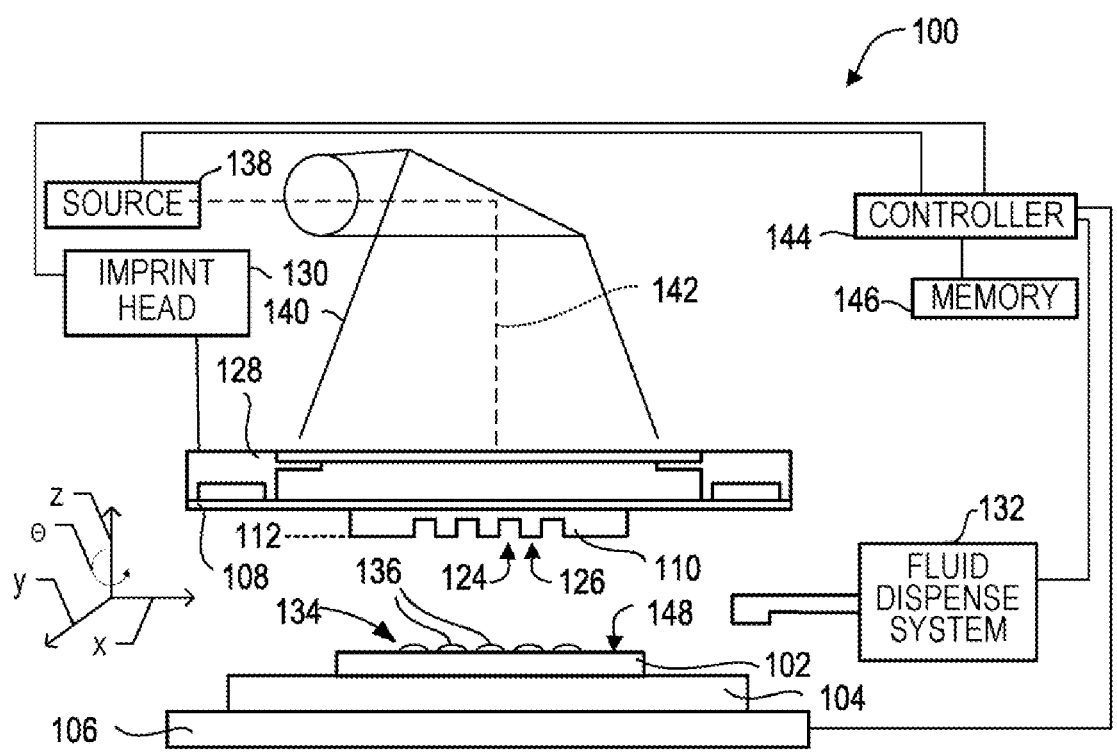
FIG. 1 depicts a side view of a nanoimprint lithography system.

FIG. 1 illustrates an imprint lithography system 100 that forms a relief pattern on a substrate 102. The substrate 102 may be coupled to a substrate chuck 104. In some examples, the substrate chuck 104 includes a vacuum chuck, a pin-type chuck, a groove-type chuck, an electromagnetic chuck, or other appropriate chuck. Exemplary chucks are described in U.S. Pat. No. 6,873,087, which is hereby incorporated by reference herein. The substrate 102 and the substrate chuck 104 may be further supported by a stage 106. The stage 106 provides motion about the x-, y-, and z-axes as well as rotation (e.g., θ) about the z-axis. In this regard, the stage 106 may refer to an XYθ stage. The stage 106, the substrate 102, and the substrate chuck 104 may also be positioned on a base (not shown).

The imprint lithography system 100 includes an imprint lithography template 108 that is spaced apart from the substrate 102. In some examples, the template 108 includes a mesa 110 (mold 110) that extends from the template 108 toward the substrate 102. In some examples, the mold 110 includes a patterning surface 112. The template 108 and/or the mold 110 may be formed from such materials including, but not limited to, fused-silica, quartz, silicon, organic polymers, siloxane polymers, borosilicate glass, fluorocarbon polymers, metal, hardened sapphire, or other appropriate material. In the illustrated example, the patterning surface 112 includes a plurality of features defined by spaced-apart recesses 124 and protrusions 126. The pattern being formed as described above is for purposes of example only and any type of pattern may be represented on the patterning surface 112. As such, the patterning surface 112 may define any pattern that forms the basis of a pattern to be formed, via imprint processing, on substrate 102.

The template 108 may be coupled to a template chuck 128. In some examples, the template chuck 128 includes a vacuum chuck, a pin-type chuck, a groove-type chuck, an electromagnetic chuck, or any appropriate chuck. Exemplary chucks are described in U.S. Pat. No. 6,873,087. In some embodiments, the template chuck 128 may be of the same type as the substrate chuck 104. In other embodiments, the template chuck 128 and substrate chuck may be different types of chucks. Further, the template chuck 128 may be coupled to an imprint head 130 such that the template chuck 128, the imprint head 130, or both are configured to facilitate movement of the template 108. Movement of the template 108 includes movement in the plane of the template (in-plane movement) and movement out of the plane of the template (out-of-plane movement) with respect to the template. In-plane movement includes translation of the template 108 in the plane of the template (e.g., in the X-Y plane as depicted in FIG. 1) and rotation of the template in the plane of the template (e.g., in the X-Y plane and about the Z axis). Translation or rotation of the template 108 with respect to the substrate 102 may also be achieved by translation or rotation of the substrate. In-plane movement of the template 108 also includes increasing or decreasing a compression force on opposite sides of the template (e.g., with a magnification actuator) to increase or decrease dimensions of the template in the X-Y plane of the template.

Mechanisms and control for applying and adjusting forces will be described below with respect to FIGS. 3-10. Out-of-plane movement of the template 108 includes translation of the template along the Z-axis (e.g., to increase or decrease a force applied to the substrate via the template by increasing or decreasing the distance between the template and the substrate) and rotation of the template about an axis in the X-Y plane of the template. Rotation of template 108 about an axis in the X-Y plane of the template changes an angle between the X-Y plane of the template 108 and the X-Y plane of substrate 102, and is referred herein to as "tilting" the template with respect to the substrate, or changing a "tilt" or "tilt angle" of the template with respect to the substrate. U.S. Pat. No. 8,387,482 discloses movement of a template via an imprint head in an imprint lithography system, and is incorporated by reference herein.

The imprint lithography system 100 may further include a fluid dispense system 132. The fluid dispense system 132 may be used to deposit a polymerizable material 134 on the substrate 102. The polymerizable material 134 may be disposed on the substrate 102 using techniques such as drop dispense, spin-coating, dip coating, chemical vapor deposition (CVD), physical vapor deposition (PVD), thin film deposition, thick film deposition, or other appropriate method. In some examples, the polymerizable material 134 is disposed on the substrate 102 before or after a desired volume is defined between the mold 110 and the substrate 102. The polymerizable material 134 may include monomers as described in U.S. Pat. No. 7,157,036 and U.S. Patent Application Publication No. 2005/0187339, both of which are incorporated by reference herein. In some examples, the polymerizable material 134 is disposed on the substrate 102 as a plurality of droplets 136.

Figure 2:
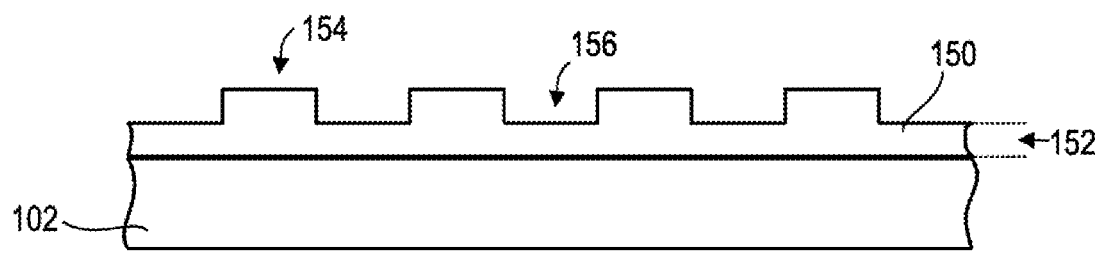
FIG. 2 depicts a side view of the substrate of FIG. 1.

Referring to FIGS. 1 and 2, the imprint lithography system 100 may further include an energy source 138 coupled to direct energy 140 along a path 142. In some examples, the imprint head 130 and the stage 106 are configured to position the template 108 and the substrate 102 in superimposition with the path 142. The imprint lithography system 100 may be regulated by a controller 144 in communication with the stage 106, the imprint head 130, the fluid dispense system 132, the energy source 138, or any combination thereof, and may operate on a computer readable program stored in a memory 146.

In some examples, the imprint head 130, the stage 106, or both, vary a distance between the mold 110 and the substrate 102 to define a desired volume therebetween that is filled by the polymerizable material 134. For example, the imprint head 130 may apply a force to the template 108 such that the mold 110 contacts the polymerizable material 134. After the desired volume is filled by the polymerizable material 134, the energy source 138 produces energy 140, such as broadband ultraviolet radiation, causing the polymerizable material 134 to polymerize and to conform to the shape of a surface 148 of the substrate 102 and the patterning surface 112, defining a polymeric patterned layer 150 on the substrate 102. In some examples, the patterned layer 150 includes a residual layer 152 and a plurality of features shown as protrusions 154 and recessions 156, with the protrusions 154 having a thickness t1 and the residual layer 152 having a thickness t2.

The above-described system and process may be further implemented in imprint lithography processes and systems referred to in U.S. Pat. No. 6,932,934, U.S. Patent Application Publication No. 2004/0124566, U.S. Patent Application Publication No. 2004/0188381, and U.S. Patent Application Publication No. 2004/0211754, all of which are incorporated by reference herein.

Imprint lithography substrates and templates may include corresponding pairs of alignment marks that allow real-time alignment of the template and the substrate. After the patterned template is positioned over the substrate (e.g., superimposed over the substrate), an alignment of the template alignment marks with respect to the substrate alignment marks is determined. Alignment schemes may include "through the mesa" (TTM) measurement of alignment errors associated with pairs of corresponding alignment marks, followed by compensation of these errors to achieve accurate alignment of the template and a desired imprint location on the substrate as disclosed in U.S. Pat. Nos. 6,916,585; 7,170,589; 7,298,456; and 7,420,654, all of which are incorporated by reference herein. Alignment errors may be caused by relative positioning of the substrate and the template, deformation of the substrate or the template, or a combination thereof. Alignment errors may also be caused by the introduction of vibration caused by one or more actions of the imprint lithography process and machinery that executes imprint lithography processes.

Figure 3:
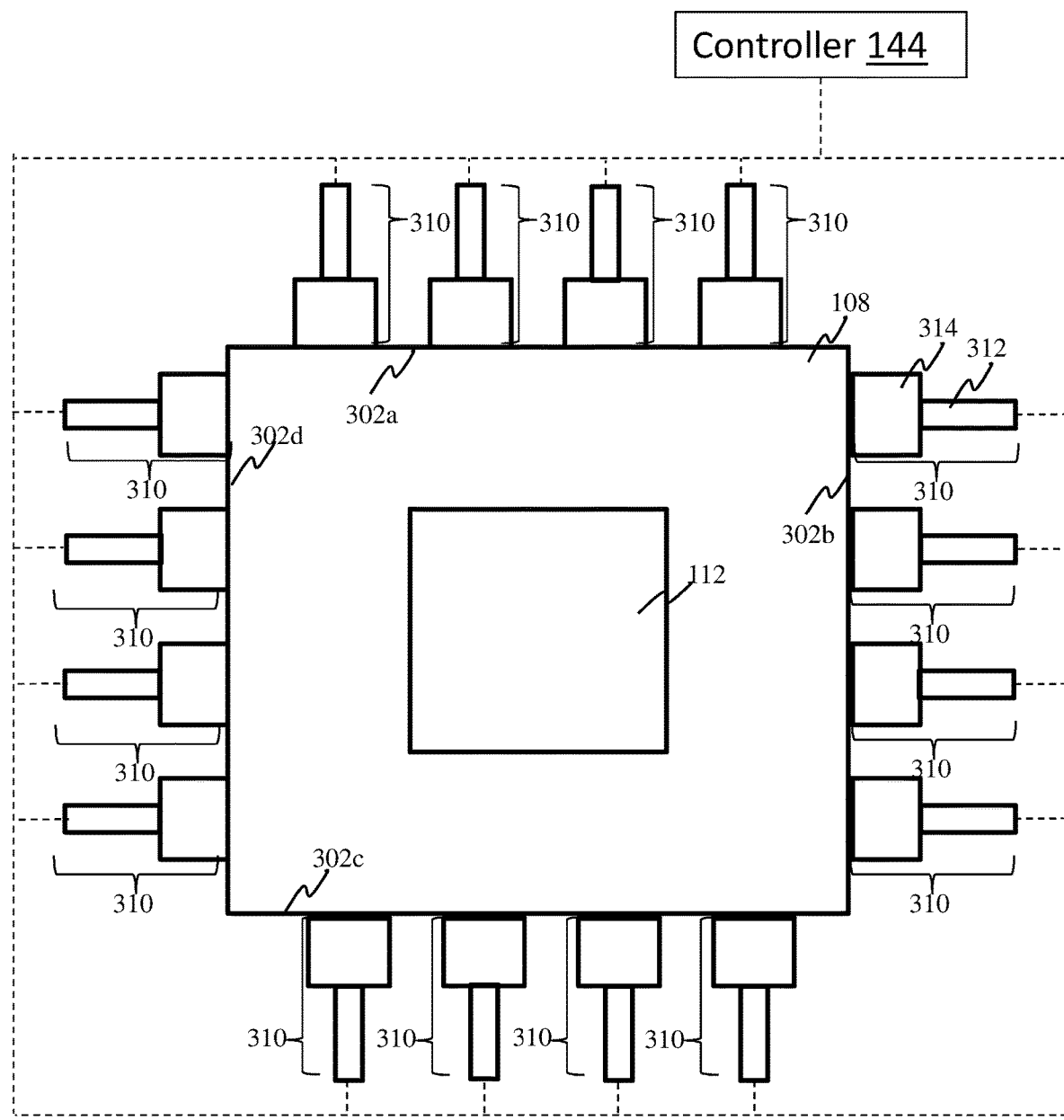
FIG. 3 depicts a configuration of deformation mechanisms.

FIG. 3 illustrates a exemplary deformation mechanisms 310 and control system that selectively determines and applies control values that are sent, communicated or otherwise transmitted to each respective deformation mechanism 310 of the plurality of deformation mechanisms. These control signals cause the respective deformation mechanisms 310 to apply and modify compressive forces applied to the template 108 shown in FIG. 1 such that an imprint pattern 112 can form a better fit with the substrate 102 and transfer the imprint pattern 112 thereto. The deformation mechanism 310 may deform the pattern area 112 of the template 108 by applying forces to four side surfaces 302a-302d of the template 108. As shown herein, this exemplary embodiment includes 16 deformation mechanisms 310. Each respective deformation mechanism 310 includes an actuator 312 connected to a contact portion 314 wherein the contact portion 314 contacts at least a portion of a template side 302a-302d adjacent thereto. Each of the deformation mechanisms 310 are connected to the controller 144 (illustrated by the dashed lines). The controller 144 executes at least one control algorithm that selectively determines an amount of force to be applied by each of the individual deformation mechanisms 310 to the sides 302a-302d of the template 108 in order to modify the shape thereof.

The controller 144, as shown in FIG. 1, includes at least one central processing unit (CPU) and memory and can execute instructions stored in the memory to perform one or more of the described operations and/or functions. The controller 144 is in communication with one or more memories (e.g., RAM and/or ROM) and, in some instances executes stored instructions to perform the one or more control operations. In other instances, the controller 144 may temporarily store data in the one or more memories that are used in calculation and generation of the various signals described hereinafter. As such, the controller 144 controls the system 100 of FIG. 1 by using a computer program (one or more series of stored instructions executable by the CPU) and data stored in the RAM and/or ROM. Here, the controller 144 may include (or may be in communication with) one or more dedicated hardware or a graphics processing unit (GPU), which is different from the CPU, and the GPU or the dedicated hardware may perform a part of the processes by the CPU. As an example of the dedicated hardware, there are an application specific integrated circuit (ASIC), a field-programmable gate array (FPGA), and a digital signal processor (DSP), and the like. In some embodiments, the controller 144 may be a dedicated controller. In others, the control system 100 may include a plurality of controllers that are in communication with one another and other components of the control system 100 to implement the operations described herein.

The connection between the controller 144 and each of the deformation mechanisms 310 enables one or more control signals (time series of control values) to be communicated to the respective deformation mechanisms 310 which control the actuators 312 to apply various levels of force to the sides 302a-302d via respective contact portions 314. These control signals may be sent, transmitted, or otherwise communicated to each of the deformation mechanisms 310 via a wired or wireless communication pathway. The actuator 312 drives the contact portion 314 to cause force to be applied to a portion of the side of the template 108 adjacent thereto. While illustrated herein as two separate components, the actuator 312 and contact portion 314 may be formed integral with one another. The actuator 312 part of the deformation mechanism 310 may be any actuation mechanism including but not limited to pneumatic, piezoelectric, magenetostrictive, and voice coils. In one embodiment, the deformation mechanisms 310 are mounted to a frame and linked together via a linkage system such that control signals can be provided to the linkage system for controlling the movement and operation of the deformation mechanisms 310.

Exemplary control algorithms include those which cause the deformation mechanism 310 to operate as a correction mechanism that physically deforms the template 108 by applying external forces from sides 302a-302d of the template 108. By applying these forces, a shape of the pattern area 112 is corrected such that a difference between the shape of the pattern (shot area) formed on the substrate and the shape of the pattern area 112 can be reduced. Thus, overlay accuracy of the pattern formed on the substrate and the pattern of the imprint material newly formed on the substrate can be improved. Exemplary components of the shape (including the size) of the pattern area 112 that can be controlled by the deformation mechanism 310 may include, for example, a magnification component, and a distortion component (for example, a component having a rhombic shape, a trapezoidal shape, or the like, or a component having a higher order).

It should be noted that the illustration of 16 deformation mechanisms as shown in FIG. 3 is done for purposes of example only and merely illustrates one possible embodiment. In other embodiments there may be N number of deformation mechanisms 310 where N is at least two. The number of deformation mechanism used may be determined based on the size of template and amounts of force desired to be applied to the various sides of the template. In one embodiment, there are an equal number of deformation mechanisms 310 on each side 302a-302d of template 108.

During the imprint process, operation of the deformation mechanisms 310 are cycled in an open loop whereby they are cycled from a first level of compressive force to a second level of compressive force and then back to a third level of compressive force. The second level of compressive force is an upper limit of compressive force defined by design of the deformation mechanism 310. The first and third levels of compressive force are each lower than the second level and are determined by system design as per the compression needed to deform the template 108 to ensure proper fit of the template to the substrate such that the curable liquid resist applied can fill into all areas, voids, and air spaces before being cured. In one embodiment, the first level and third level represent substantially a same level of compressive force. In another embodiment, the first level and third level represent different levels of compressive force so long as each of the different levels are less than the upper limit defined by the second level. It is preferred to cycle from the second level to the third level because magnification control prior to dispensing of the resist (e.g., fluid fill (FF)) is more repeatable starting from a high compressive state. In an alternative embodiment, the second level of compressive force is a lower limit of compressive force defined by design of the deformation mechanism 310 and the first and third levels are above the second level. In an alternative embodiment, the second level of compressive force is a set of values in which one or more of the compressive forces of the deformation mechanisms 310 are not at their limits.

The problem with the cycling described above is it leads to unbalanced magnification forces that could result in template slippage causing a poor imprint on the substrate. These problems are caused by each of the deformation mechanisms 310 reaching the second level (e.g., upper limit) at different times and then each deformation mechanism 310 exiting the upper limit to cycle down to the third level (e.g., lower compressive state) at different times. The control algorithm according to the present disclosure provides a magnification force (Mag) scheme that uses individual ramp trajectories for each of a plurality of deformation mechanisms 310 (e.g., actuators) that calculates a final force value for each individual deformation mechanism 310 to be applied during the ramp up to the upper limit of compressive force so that all of the deformation mechanism reach the initial upper value time at the same time. This advantageously causes each of the plurality of deformation mechanisms to reach their upper limit of compressive force at the same time. The result is Mag force remains balanced and causes a smooth transition at an end of the Mag ramp period thereby reducing the risk that the template will slip out of position prior to dispensing and curing of the liquid curable resist to achieve pattern transfer.

FIGS. 4-7 illustrate various aspects of a control algorithm for controlling the Mag force applied by respective ones of the plurality of deformation mechanisms 310 to the template 108 by the plurality of deformation mechanisms. The algorithms described herein are executed by the controller 144 shown in FIGS. 1 and 3. Each controller 144 may comprise a series of stored instructions that are executed by the CPU of controller 144 to perform the described functions. In other embodiments, each controller described herein may be embodied as individual integrated circuits each with their own CPUs and memories and are dedicated to performing the processing associated therewith. In other embodiments, one or more of the controllers described herein may be embodied as a single integrated circuit. Further, in some embodiments, some of the described controllers may be dedicated processing units and be in communication with the CPU of the controller which is executing stored instructions to complete the function operations described herein.

Figure 4:
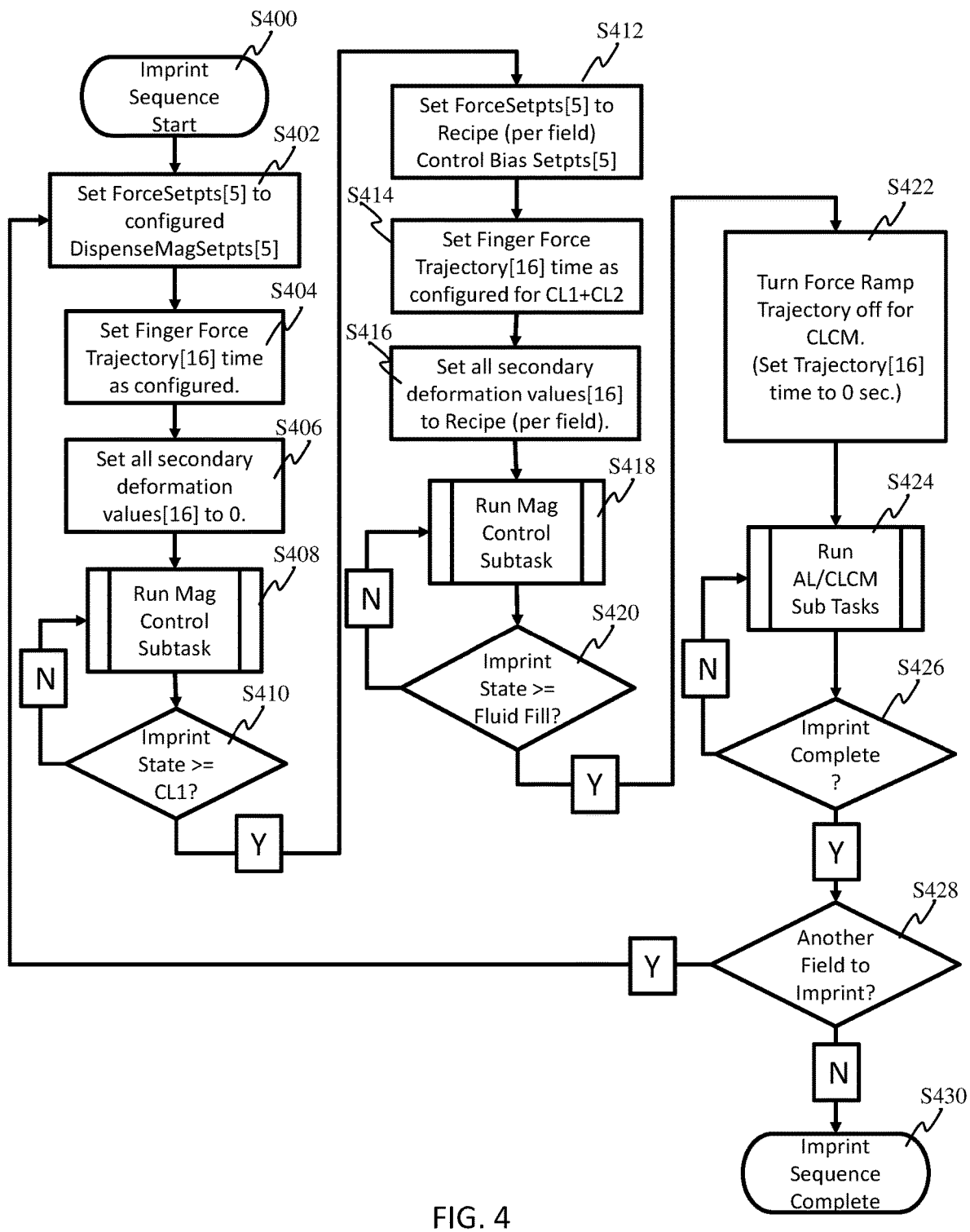
FIG. 4 is a flow diagram of a control algorithm that controls the deformation mechanisms.

FIG. 4 illustrates an algorithm for a Mag control sequence for use in an imprint lithography process. In operation, the Mag control sequence ensures that forces are applied to the template before the template is caused to be contacted to the substrate. In exemplary operation, the liquid curable resist is generally dispensed on a particular field of the substrate being imprinted prior to the Mag control sequence being performed. However, that need not be the case so long as the Mag force applied by the deformation mechanisms 310 are applied prior to the template contacting the substrate.

In summary operation, the process calculates and runs force trajectories for each of the plurality of deformation mechanisms (also known as "fingers"). The final force trajectory that is to be supplied by each deformation mechanism 310 to a portion of the side of the template 108 is calculated using a plurality of distortion parameters and a force correction matrix. A form of secondary deformation may be provided via a secondary deformation mechanism that is controlled based on one or more secondary deformation value(s) applied during the closed loop control magnification trajectory final forces that are used in the ramping targets at fluid fill start time. The secondary deformation mechanism is a type of deformation mechanism other than deformation mechanism 310. This secondary deformation mechanism may provide a spatio-temporal adjustable distribution of heat to one or both of the substrate and template causing a spatially varying thermal expansion as described in U.S. Pat. Nos. 9,823,562 and 9,927,700 which are hereby incorporated by reference. The heat may be supplied by an LED or laser modulated by spatial light modulator. The secondary deformation mechanism may also include a zone type substrate chuck (otherwise known as substrate holding unit or substrate holder) with a plurality of independently controllable zones (otherwise known as regions or concave portions) to independently control the pressure (positive or negative) applied to each zone as described in US Patent Publications Nos. 2019/0310547 and 2020/0183270 which are hereby incorporated by reference. In this way all forces applied by the deformation mechanisms 310 will enter and leave saturation (e.g., either their upper limit of compressive force or the lower limit of compressive force) at the same time, based on individually calculated finger ramp trajectories. Moreover, the calculated force trajectories will not exceed the saturation level (upper or lower) at any time.

In one embodiment, the algorithm uses five distortion parameters (e.g. set points) including values associated with a magnification force in the X direction (MagX), a magnification force in the Y direction (MagY), a skew parameter (Skew), trapezoidal distortion in the X direction (TrapX) and trapezoidal distortion in the Y direction (TrapY). In one embodiment, each value for each distortion parameter represents a trajectory.

Turning now to FIG. 4, the imprint process starts at S400. In step S402, the algorithm sets distortion parameter (ForceSetpts) values associated with an initial distortion parameter values associated with a first state (DispenseMagSetpts) representing the dispense magnification state beginning at time=0. The dispense magnification state is the state of the deformation mechanisms 310 while droplets 136 are being dispensed by the fluid dispense system for the field about to be imprinted. In an alternative embodiment, the dispense magnification state is the state of the deformation mechanisms 310 after the template 108 has separated from the previous field that was imprinted and prior to the template contacting the current field to be imprinted. In one embodiment, in this first state, the set points would be associated with high compressive force for MagX and MagY and the setpoint values for Skew, TrapX, and TrapY are typically 0. In step S404, a distortion mechanism 310 force trajectory time value is set as configured. This represents an amount of time for each distortion mechanism 310 to reach the upper limit compression force. In step S406, the algorithm sets secondary deformation values for to zero. Steps S402-S406 represent an initialization period prior to the first field on the substrate being imprinted with a pattern on the template.

Figure 5:
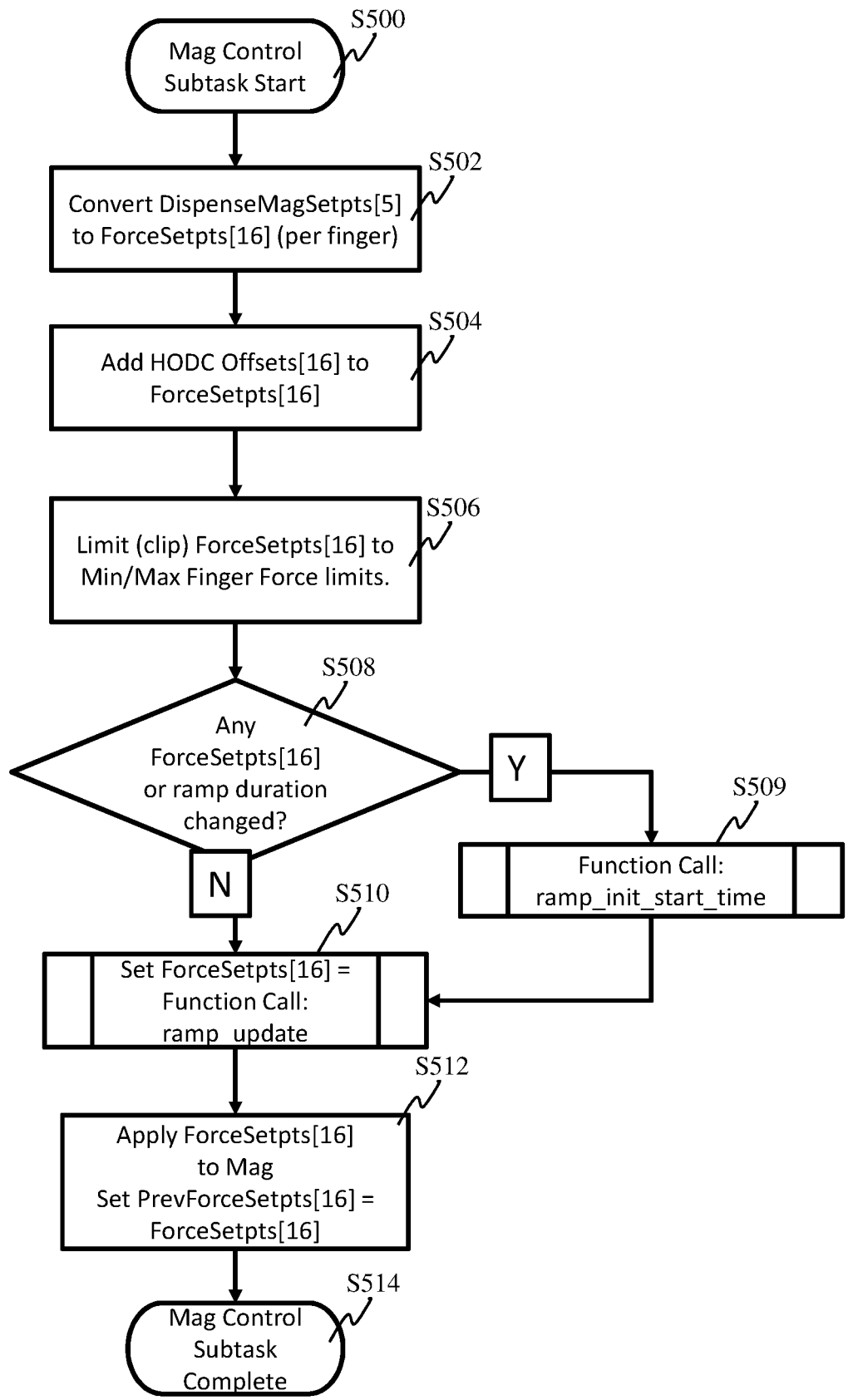
FIG. 5 is a flow diagram of an aspect of the control algorithm that controls the deformation mechanisms.

At this time, the algorithm, in S408, executes a magnification control subtask which is further described in FIG. 5. The magnification control subtask starts at S500. In step S502, the initial distortion parameter values are converted by calculation into force values by using a correction matrix. The correction matrix is a transformation matrix having a size equal to a number of distortion parameters by a number of distortion mechanisms 310 in the system. In an exemplary embodiment, the number of distortion parameters is five and a number of distortion mechanisms 310 is 16 such that the correction matrix is a 5×16 matrix and may be calculated in parallel as described in U.S. Pat. No. 7,768,624 the disclosure of which is incorporated herein by reference in its entirety. The force values calculated in S502 are done on a per distortion mechanism 310 basis such that the number of force values calculated in S502 equals the number of distortion mechanisms 310 in the system. In step S504, a secondary deformation value is added to each calculated force value. In one embodiment, the secondary deformation values are based on a calibration process associated with the particular substrate being imprinted based on the measurement of the substrate. In another embodiment, these values predefined based on the type of substrate. Exemplary types of secondary deformation mechanisms and values used in controlling them are described in U.S. Pat. No. 9,594,301 the disclosure of which is incorporated herein by reference in its entirety. Thereafter, in step S506 the calculated force values for each distortion mechanism 310 are limited by minimum and maximum force limits associated with the distortion mechanism 310 such that the calculated force value cannot be below a minimum force value to be applied by the distortion mechanism 310 and it cannot exceed a maximum force value to be applied by the distortion mechanism 310. The maximum force value to be applied represents the upper limit compressive force value the is defined by design of the system.

Figure 6:
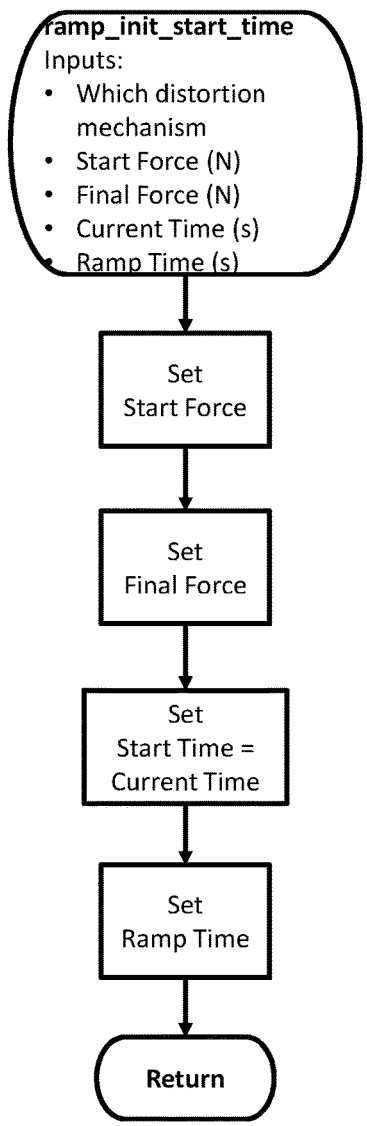
FIG. 6 is a flow diagram of an aspect of the control algorithm that controls the deformation mechanisms.
Figure 7:
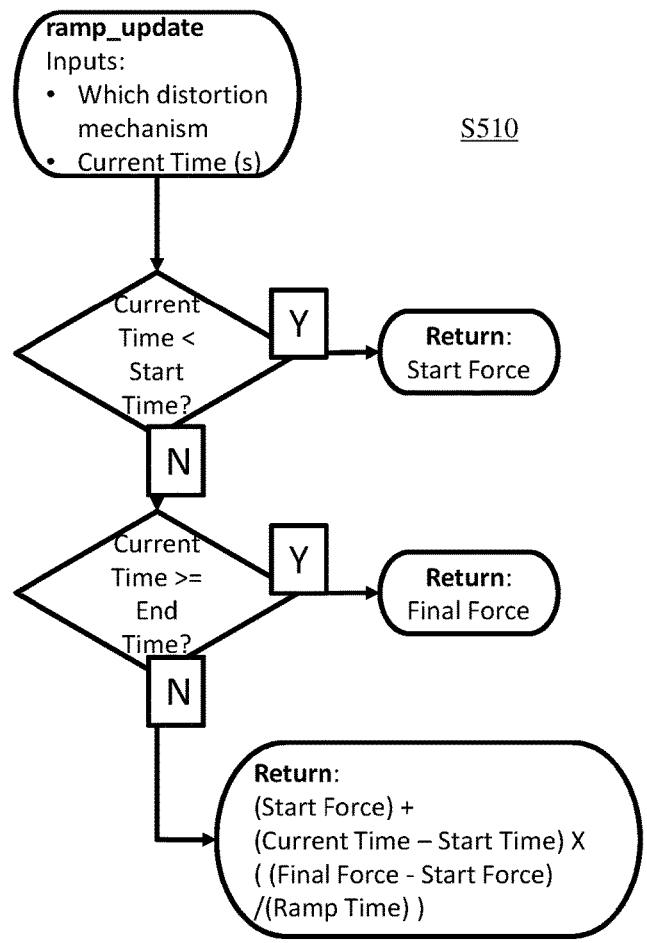
FIG. 7 is a flow diagram of an aspect of the control algorithm that controls the deformation mechanisms.

In step S508 the subtask queries whether one or more setting values have changed. In one embodiment, the algorithm queries whether there has been a change in final force trajectory values for one or more distortion mechanisms 310. In another embodiment, the algorithm queries whether there has been a change in ramp duration time. In another embodiment, the algorithm performs each of the above queries in succession. If the result of the query is yes indicating that there has been a change in setting values (either force values or ramp duration values), the algorithm performs, in S509 a first function call "ramp_init_start_time" which sets the various force and time parameter values to be used. The first function call which configures a ramp trajectory for a respective one of the plurality of distortion mechanisms 310 with a given start force, final force, start time, and ramp is illustrated in FIG. 6. As shown in FIG. 6, the first function call takes, as inputs, identifiers identifying the particular distortion mechanism 310 with which the setting values are associated. The setting values include a starting force value, a final force value, a current time and a ramp time. This results in each of these values being set for use by the system to control the force to be applied by the distortion mechanisms 310. Returning back to S508 in FIG. 5, after the first function call of S509, the algorithm performs a second function call S510 to identify, for each distortion mechanism 310, a force value to be applied at the given time. The second function call which is called iteratively during the ramping time to calculate the force value setpoints for respective distortion mechanisms 310 for the given elapsed time within the ramp period is illustrated in FIG. 7. As shown in FIG. 7, the second function call takes, as inputs, identifiers identifying the particular distortion mechanism 310 and a current time value to determine the force value to applied to and associated with a particular one of the plurality of distortion mechanisms 310. The second function call determines whether a current time value is earlier than a start time value and if so, the starting force value set during the first function call is used and associated with the respective distortion mechanism 310 being checked. If the current time is not earlier than the start time, the second function queries whether the current time value is later than or equal to the set final time (e.g. end time), then a final force value set during the first function call is returned and used for the respective distortion mechanism 310 being checked. If the second function determines that the current time not later than or equal to the final time, the force value to be associated with the respective distortion mechanism 310 being checked is calculated according to the following equation:

(Start Force)+(Current Time−Start Time)×((Final Force−Start Force)/(Ramp Time))

The result of the second function in S510 yields force value set points for each of the plurality of distortion mechanisms 310 such that, when applied, each distortion mechanism 310 will enter and exit the next phase of imprint processing together thereby reducing template imbalance. In step S512, the respective force values for each of the plurality of distortion mechanisms 310 are set thereby replacing any previously stored distortion mechanism 310 force value and the subtask of FIG. 5 ends in S514 returning us back to the algorithm of FIG. 4.

Upon completion of the subtask in S408, the algorithm queries the current operational state at the current time in S410. More specifically, S410 queries whether the system is in the CL1 state indicating a time at which the template is compressed according to the individual force compression values set during the dispense magnification period and the template first contacts the polymerizable material 134 on the substrate 102 and the template may be bowed out by back pressure applied to a center portion of the template 108 by the template chuck 128. During the CL1+CL2 period, the individual distortion mechanisms 310 ramp down from the upper limit compression force value which all distortion mechanisms 310 were ramped up to at the same time. During the CL1 phase, the individual distortion mechanisms 310 are controlled to ramp down the force applied to the template to allow for dynamic spread of the formable material 134 to the edge of the imprint field. At the end of CL1 is the CL2 phase where the imprint force and back pressure are quickly relaxed to their fluid fill (FF) force and back pressure values which allows the polymerizable material 134 to fill into remaining spaces, voids and other areas defined by the template.

The above operations are performed in steps S412-S418. More specifically, in S412 distortion parameter values, which in some embodiments, include control bias force values are used in the calculation of final force trajectories for each of the particular deformation mechanisms 310. The control bias force values are set according to the particular characteristics of the particular imprint process. The control bias force values are a component that is used in determining of the final target forces which are the forces supplied by the plurality of distortion mechanisms 310 at the beginning of the closed loop control of the magnification (CLCM). The force applied by each of the distortion mechanisms 310 is reduced from the upper limit compressive force value to predefined force levels whereby each of the plurality of distortion mechanisms 310 begin the reduction of applied force at the same time. In S414, the force trajectory time for each of the plurality of distortion mechanisms 310 is set to a time equal to a time for the CL1 phase plus a time for the CL2 phase and in S416, secondary deformation value(s) for each of the plurality of distortion mechanisms 310 are set according to the particular characteristics of the imprint process. In S418 the Mag Control Subtask is reinitiated and operates as discussed above with respect to S408 with the only difference being the ramping for each of the plurality of distortion mechanisms 310 begins at the same start time and the force values are iteratively reduced during a Ramp Time from the upper limit of compressive force (Start Force[16]) to arrive at the predefined force values (Final Force[16]) at the same end time. In an alternative embodiment, S418 the Mag Control Subtask may be reinitiated the ramping for each of the plurality of distortion mechanisms 310 begins at the same start time and the force values are iteratively changed during a Ramp Time from a set value of compressive force (Start Force[16]) to arrive at the predefined force values (Final Force[16]) at the same end time (final time).

At the conclusion of S418, the algorithm, in step S420 queries, using current time values whether the CL1 and CL2 periods have ended indicating that the process has entered the fluid fill (FF) phase. If not, the mag control subtask is repeated and the individual distortion mechanisms 310 are continually individually ramped to their final target forces until such time that the query in S420 indicates that the imprint process has entered the fluid fill phase. At this point the algorithm shuts off the individual control of the distortion mechanism 310 and initiates the closed loop control of the magnification force (CLCM) to be applied by the distortion mechanisms 310 during the FF phase. During the FF phase the curable liquid resist fills in all open spaces and voids around and between the template and substrate. As such, in step S422, the CLCM is engaged and the trajectory time for each distortion mechanism 310 is set to zero so that alignment of the template to the substrate can be performed before the pattern is cured on the substrate. The alignment processing and CLCM processing is executed in S424 and can be performed using any known alignment algorithm for imprint lithography processing. Step S424 may include active measurement of the alignment template relative to the substrate which includes the measurement of a plurality of alignment marks as described in US patent publication No. 2020/0379343 which is hereby incorporated by reference. Step S424 may include calculation of an overlay error between the current field being imprinted on the substrate 102 and a mesa 110 on the basis of results detected by a plurality of alignment scopes. Each alignment scope may be set up to measure a relative position of an alignment mark set including: a substrate alignment mark and a template alignment mark. There are at least 2 alignment mark sets and there may be as many as 4, 6, 8, 16, 24, or 30 alignment mark sets. The plurality of relative positions are then used to estimate alignment errors (shift in x; shift in y; rotation) and deformation components which may include 2 or more of: MagX; MagY; Skew; TrapX; TrapY: and other components having a higher order representing potential distortion of the template. Further examples of the processes performed in S424 regarding alignment processing are described in U.S. Pat. Nos. 7,828,984, 8,845,317, 9,579,843 and 9,573,319 all of which are incorporated herein by reference and CLCM processing are described in U.S. Pat. Nos. 10,635,072 and 10,216,104, all of which are incorporated herein by reference.

Figure 8:
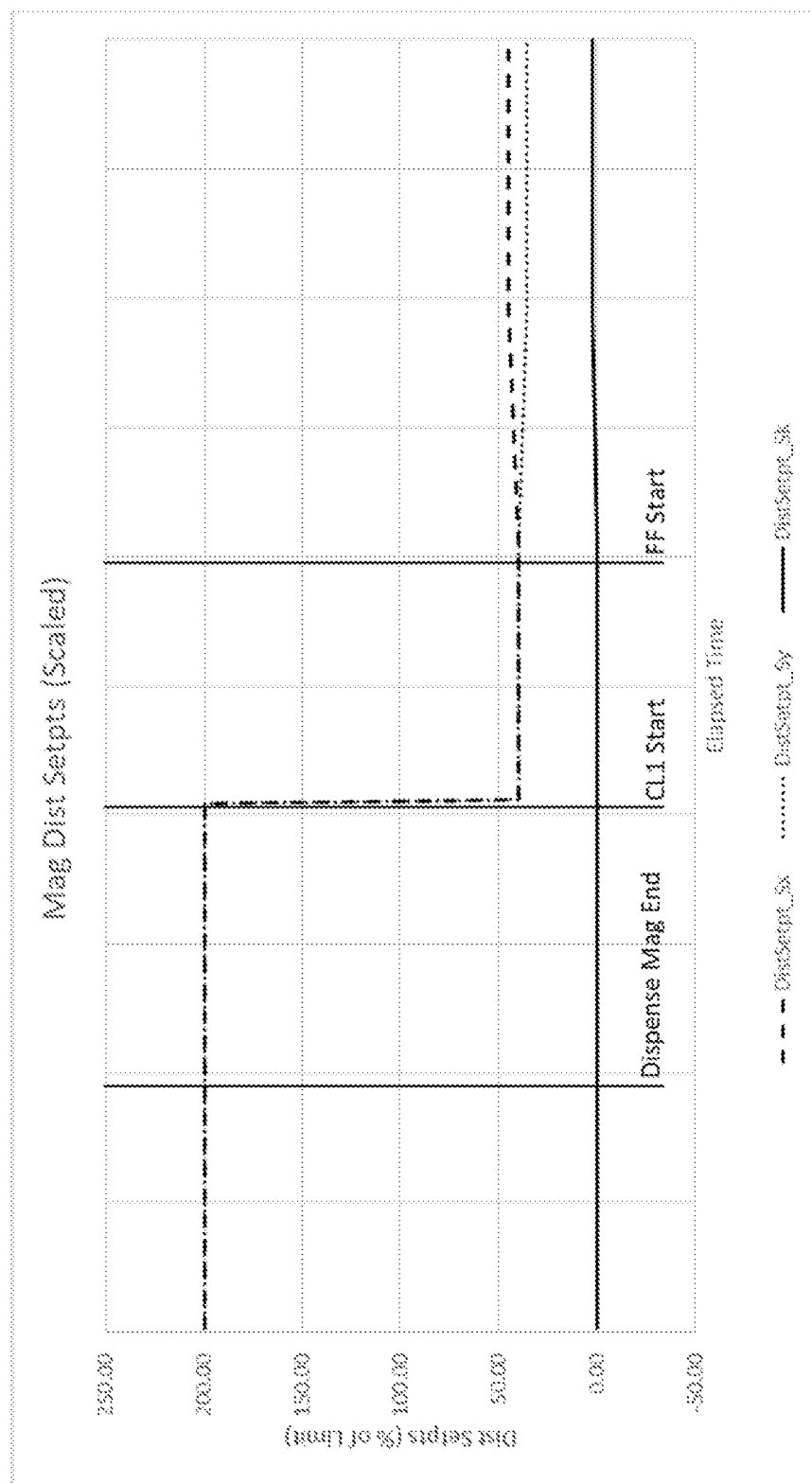
FIG. 8 is a plot illustrating a portion of the control algorithm in operation.

The algorithm in step S426 queries whether the imprint of a current field has been completed. If not, the algorithm returns back to S424. If the imprint on a particular field is completed, the algorithm determines, in S428, whether one or more other fields on the substrate need to be imprinted. If the determination in S428 indicates that one or more other fields are available for imprinting, the algorithm returns to S402. If not, the imprint sequence ends at 430. The impact of the Mag control subtask of FIG. 5 (and associated function calls in FIGS. 6 & 7) when incorporated into the imprinting algorithm of FIG. 4 is illustrated in the graphical plots of FIGS. 8-10 and the advantages conferred thereby can be understood in the comparison of FIGS. 8-10 with exemplary prior art distortion application control illustrated in FIGS. 11-13. Specifically, FIG. 8 illustrates the setting of the distortion parameters values which are stepped. As shown in FIG. 8, the values for the respective distortion parameters are stepped and all changed at a given time depending on the particular phase of the imprint process. This stepped setting of the values for the distortion parameters allows for the calculation to run force trajectories for each of the plurality of distortion mechanisms 310 by using the stepped value set as shown in FIG. 8 and determining the force trajectory by combining the stepped values for each of the distortion parameters with the correction matrix. For example, the distortion parameters are set at a first value during the dispense magnification control phase until it is changed to a second lower value at a start of the CL1 phase of the imprint process. As a result of the independent control of each of the distortion mechanisms 310, they all have individual force trajectories that allow them to ramp up to and arrive at an upper limit all at the same time and remain there until a start of the CL1 phase whereby force trajectories for each of the plurality distortion mechanisms 310 begin the ramp down process from the upper limit at the same time until the beginning of the fluid fill (FF) phase. This independent ramping of respective distortion mechanisms 310 reaching the upper limit is illustrated in the circle labeled 902 in FIG. 9 and the simultaneous exit from the upper limit beginning the ramp down at the start of the CL1 phase is illustrated in the circle labeled 904 in FIG. 9. Because the distortion mechanisms 310 are individually controlled such that their individual force trajectories are calculated using the five distortion parameter setpoints in combination with the correction matrix which takes into account these five distortion parameters and the force trajectories of each of the other distortion mechanisms 310 and without the application of secondary deformation value(s), it all allows for each of the distortion mechanisms 310 to reach the upper limit at the same time and then exit the upper limit at the same time. Because all of the distortion mechanisms 310 arrive and leave the upper limit at the same time magnification forces remain balanced so as to not induce template slip and high-order Mag distortions. This balance is illustrated in FIG. 10 wherein there is substantially no deviation beyond the zero value indicating that magnification forces remain balanced across all phases indicated in FIG. 10.

Figure 9:
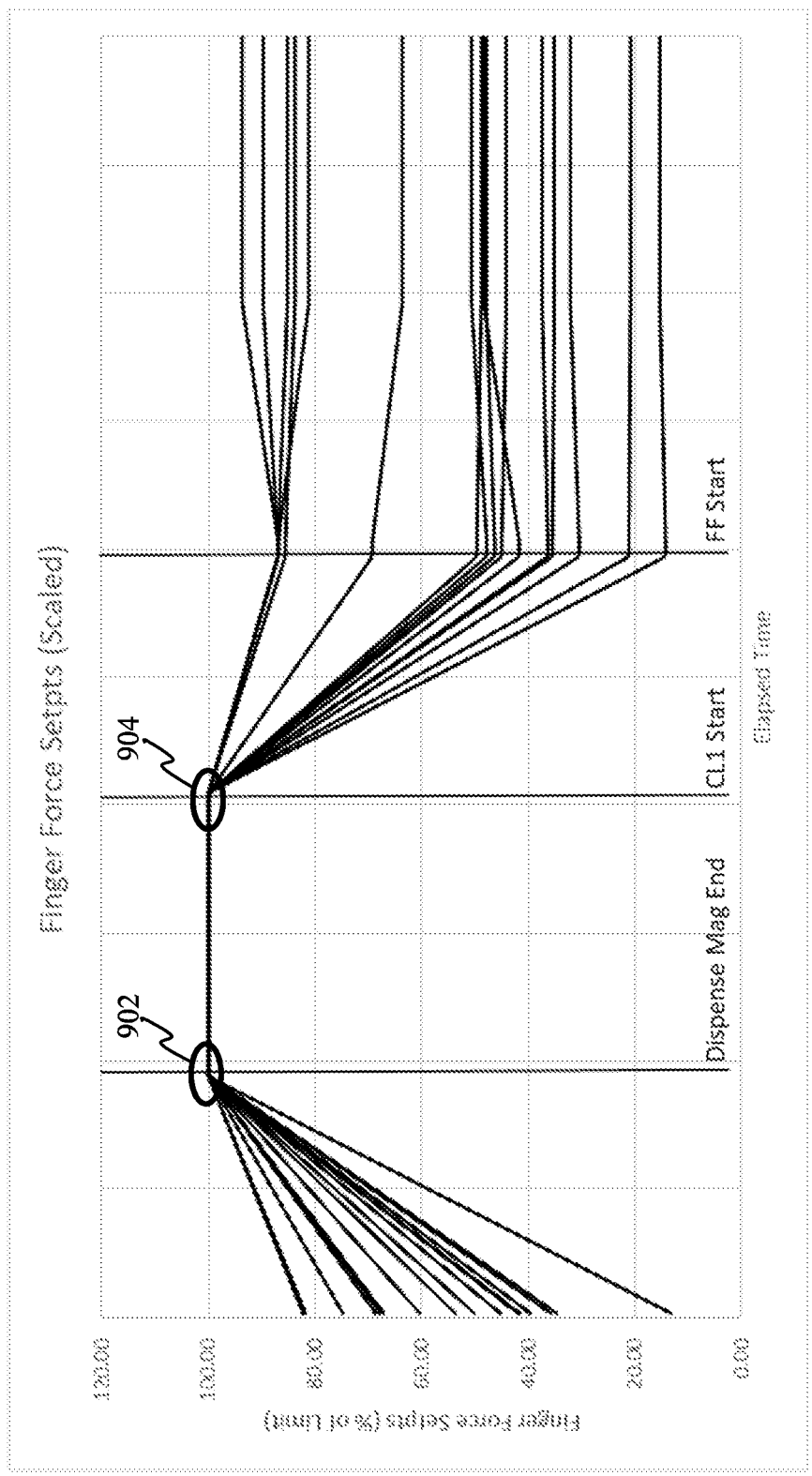
FIG. 9 is a plot illustrating a portion of the control algorithm in operation.
Figure 10:
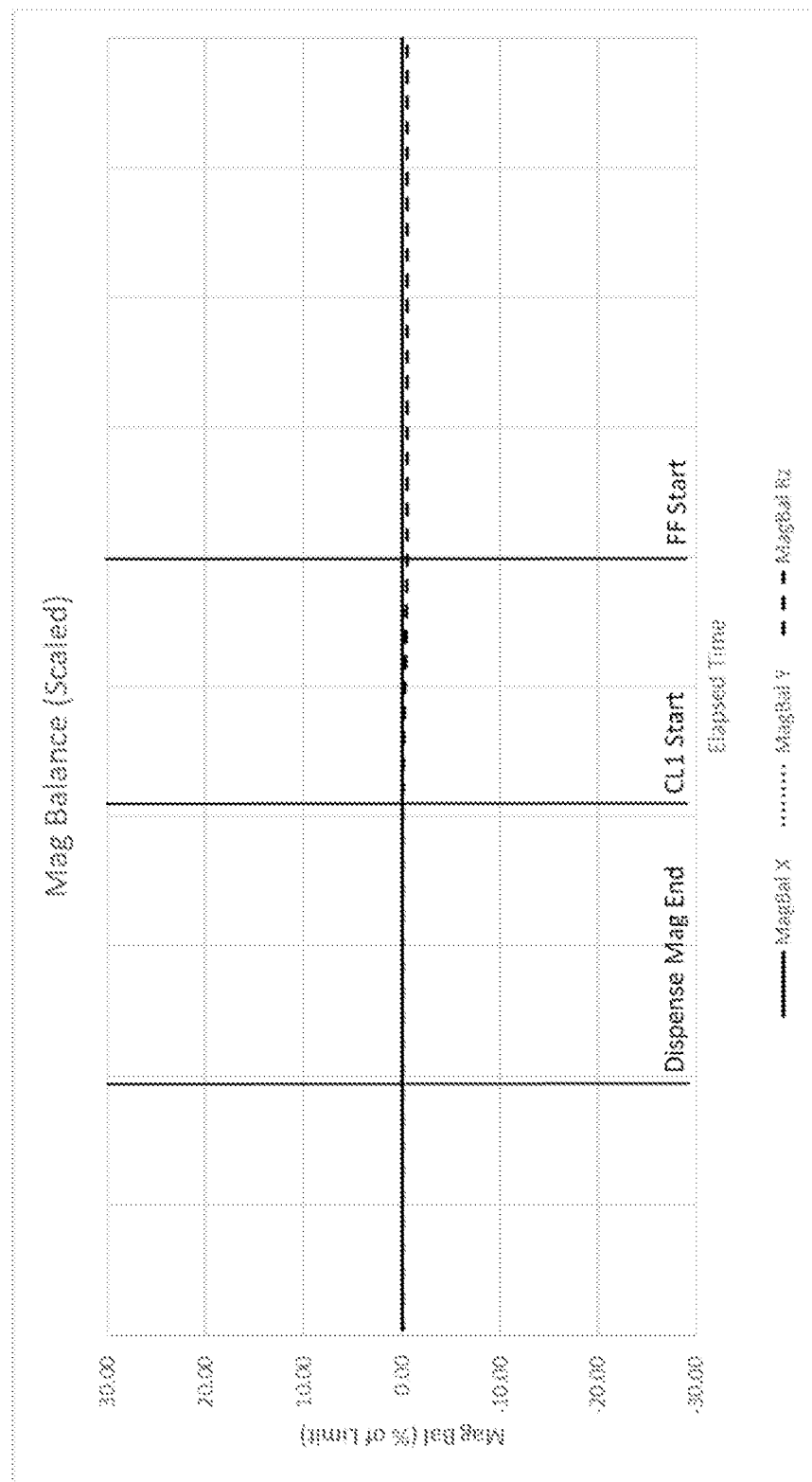
FIG. 10 is a plot illustrating an impact of the control algorithm.
Figure 11:
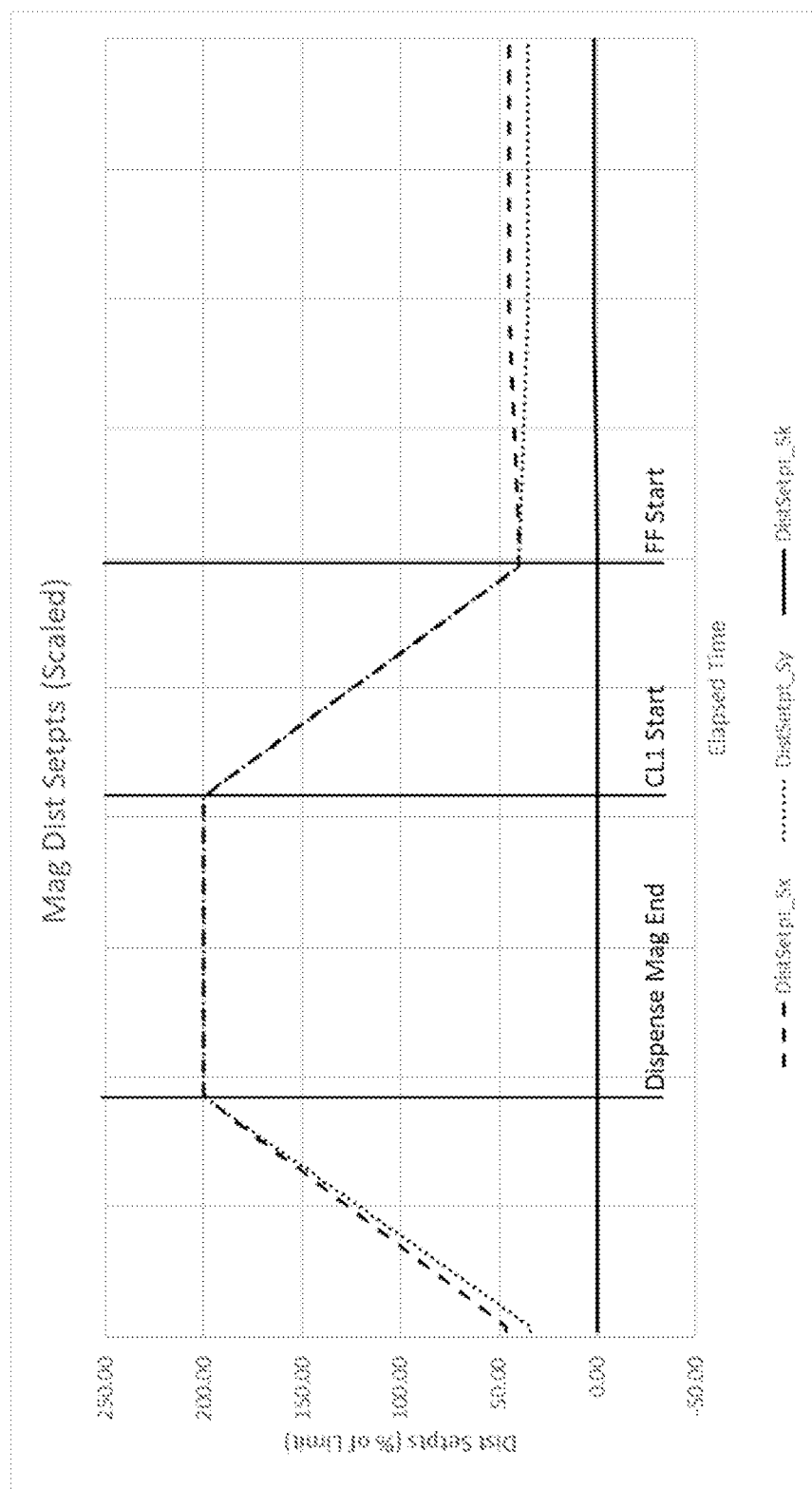
FIGS. 11-13 are plots illustrating prior art control algorithms.
Figure 12:
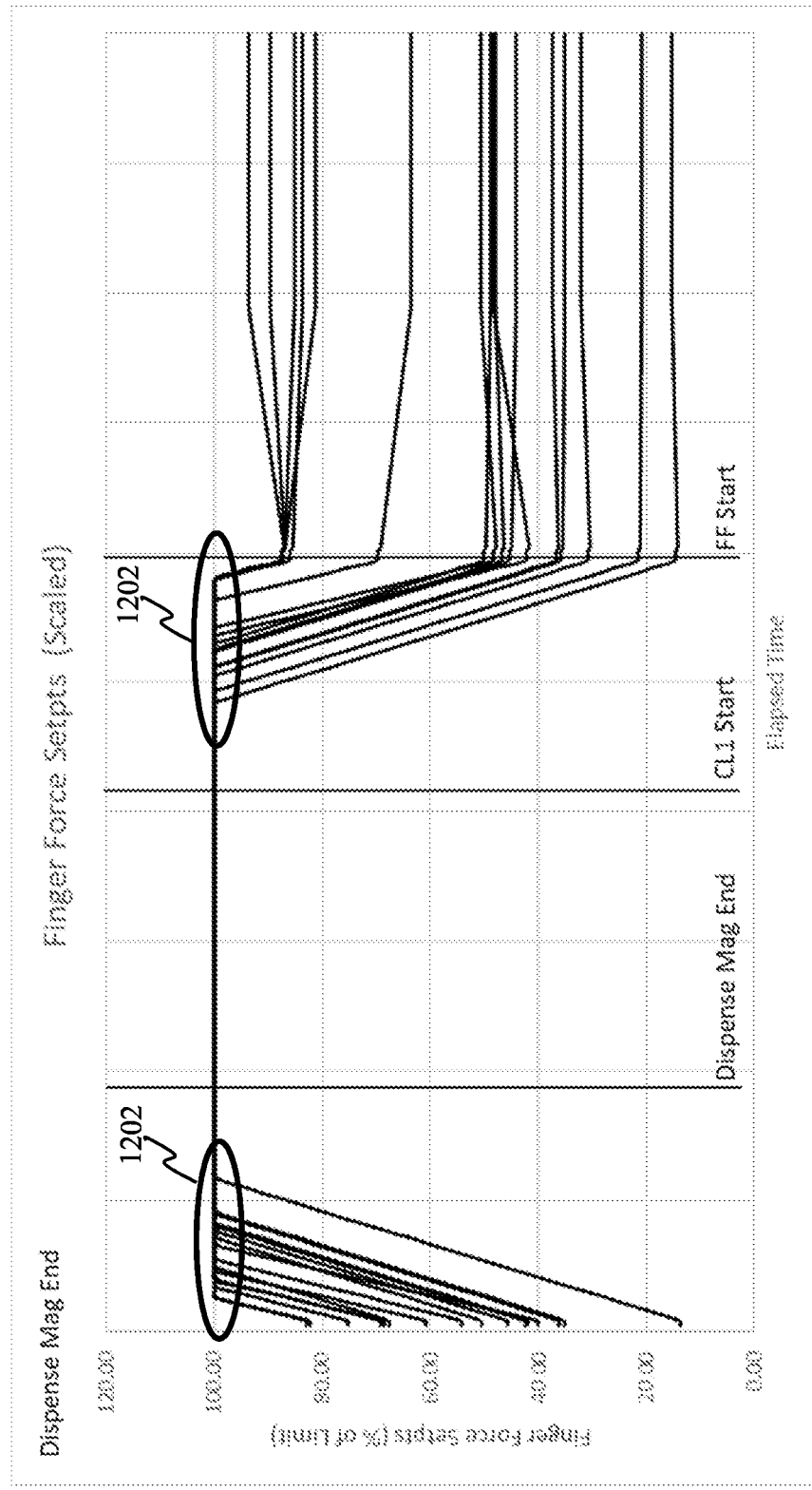
Figure 13:
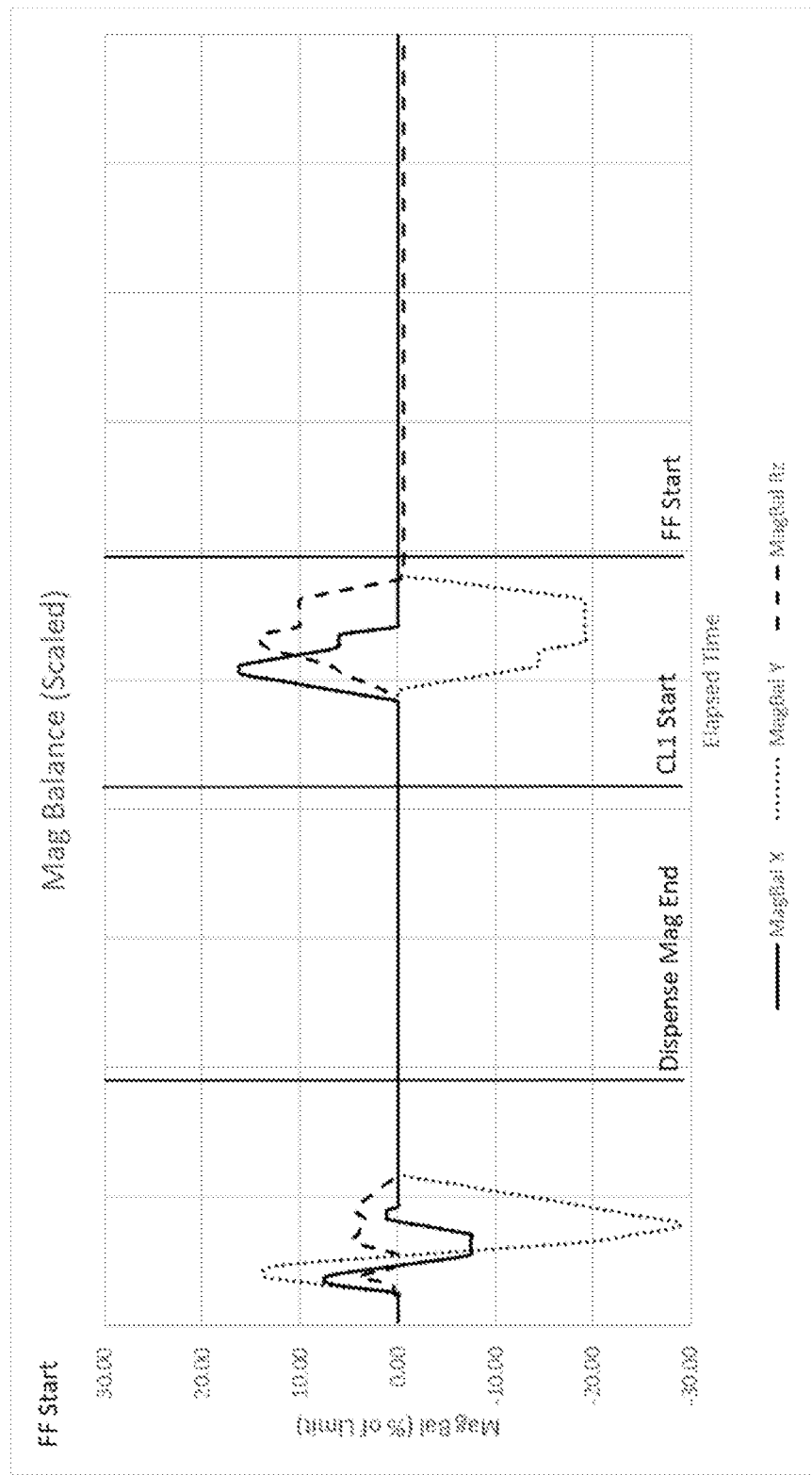

The advantages provided by the control algorithm described herein are clear when looking at the plots of FIGS. 11-13 which illustrate the same periods illustrated in FIGS. 9-11 but using a convention distortion control method. The distortion control method used herein ramps the distortion parameter values over the same periods, taking into account the secondary distortion supplied by the secondary deformation mechanism. These are then applied equally to control the distortion members in unison as shown in FIG. 11. The drawbacks of this type of control algorithm is shown in FIG. 12 whereby in the circle labeled 1202, each of the distortion members arrive at the upper limit at different time periods and also exit the upper limit at different time periods as shown in the circle labeled 1204. The impact on this is imbalance which can induce template slip and high order distortion. This resulting balance of magnification forces across the distortion members are shown in FIG. 13 which illustrates large distortion of magnification forces in different periods of the imprint process. Moreover, the imbalance differs depending on which phase of the process leading to further chances of template slippage prior to fluid fill phase and high order distortion errors.

As discussed above with respect to FIGS. 8-10, the control algorithm described above in FIGS. 4-7 provide for individualized control of distortion members to enter and exit upper limit compressive force levels as the same time resulting in improved balance of magnification forces which minimize the change for template slippage and an improvement to the imprint lithography process.

A number of implementations have been described. Nevertheless, it will be understood that various modifications may be made without departing from the spirit and scope of the disclosure. Accordingly, other implementations are within the scope of the following claims.

An embodiment of the present disclosure can be carried out by providing a program implementing one or more functions of the above-described embodiment to a system or apparatus via a network or storage medium and reading and executing the program with one or more processors in a computer of the system or apparatus. Also, an embodiment of the present disclosure can be carried out by a circuit implementing one or more functions (for example, an application specific integrated circuit (ASIC)).

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

In referring to the description, specific details are set forth in order to provide a thorough understanding of the examples disclosed. In other instances, well-known methods, procedures, components, and circuits have not been described in detail as not to unnecessarily lengthen the present disclosure.

It should be understood that if an element or part is referred herein as being "on", "against", "connected to", or "coupled to" another element or part, then it may be directly on, against, connected or coupled to the other element or part, or intervening elements or parts may be present. In contrast, if an element is referred to as being "directly on", "directly connected to", or "directly coupled to" another element or part, then there are no intervening elements or parts present. When used, term "and/or", includes any and all combinations of one or more of the associated listed items, if so provided.

Spatially relative terms, such as "under" "beneath", "below", "lower", "above", "upper", "proximal", "distal", and the like, may be used herein for ease of description to describe one element or feature's relationship to another element(s) or feature(s) as illustrated in the various figures. It should be understood, however, that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, a relative spatial term such as "below" can encompass both an orientation of above and below. The device may be otherwise oriented (rotated 90° or at other orientations) and the spatially relative descriptors used herein are to be interpreted accordingly. Similarly, the relative spatial terms "proximal" and "distal" may also be interchangeable, where applicable.

The term "about," as used herein means, for example, within 10%, within 5%, or less. In some embodiments, the term "about" may mean within measurement error.

The terms first, second, third, etc. may be used herein to describe various elements, components, regions, parts and/or sections. It should be understood that these elements, components, regions, parts and/or sections should not be limited by these terms. These terms have been used only to distinguish one element, component, region, part, or section from another region, part, or section. Thus, a first element, component, region, part, or section discussed below could be termed a second element, component, region, part, or section without departing from the teachings herein.

The terminology used herein is for the purpose of describing particular embodiments only and is not intended to be limiting. As used herein, the singular forms "a", "an", and "the", are intended to include the plural forms as well, unless the context clearly indicates otherwise. It should be further understood that the terms "includes" and/or "including", when used in the present specification, specify the presence of stated features, integers, steps, operations, elements, and/or components, but do not preclude the presence or addition of one or more other features, integers, steps, operations, elements, components, and/or groups thereof not explicitly stated.

The foregoing merely illustrates the principles of the disclosure. Various modifications and alterations to the described exemplary embodiments will be apparent to those skilled in the art in view of the teachings herein.

In describing example embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner.

We claim:

1. An apparatus comprising:
two or more force actuators, wherein each of the two or more force actuators has a defined force value; and
a controller, coupled to each of the two or more actuators, and configured to,
for each of the two or more force actuators,
calculate a ramp trajectory over a given ramping period that causes the respective actuator to reach an initial defined value time at a same time;
iteratively update the calculated ramp trajectory during ramping period to calculate, for each actuator of the two or more actuators, force trajectory values for a given elapsed time within the ramping period;
send a first set of control signals including the calculated force trajectory values to each of the actuators to ramp forces supplied to reach the initial defined force value at a same initial defined value time; and
send a second set of control signals including the calculated force trajectory values to each of the actuators to reduce the forces supplied starting at a same final defined value time to individual set point values;
wherein the controller sends control signals as first control signals if a time is earlier than the initial defined value time and the controller sends control signals as second control signals if a time is later than the final defined value time, and
wherein each of the two of more force actuators reach their individual set point values at a same set point time.

2. The apparatus of claim 1, wherein the defined force value represents a maximum amount of force able to be applied by each actuator.

3. The apparatus of claim 1, wherein the defined force value represents a minimum amount of force able to be applied by each actuator.

4. The apparatus of claim 1, wherein each of the first set of control signals and the second set of control signals includes respective force trajectories to be applied to each of the actuators that control an amount of force applied by the each of the actuators over time.

5. The apparatus of claim 4, wherein the controller is further configured to:
for each actuator of the two or more actuators,
calculate the force trajectory based on at least one force parameter and a correction matrix that transforms values of the at least one force parameter across a total number of the two or more actuators;
send, as first control signals or second control signals, the calculated force trajectories to respective actuators of the two or more actuators,
wherein control signals are sent as first control signals if a time is earlier than the initial defined value time and the control signals are sent as second control signals if a time is later than the final defined value time.

6. The apparatus of claim 1, wherein the first control signals and the second control signals cause each of the at least two actuators to be ramped together at a common ramp start time and for a same ramp duration.

* * * * *